United States Patent
Rahul et al.

(10) Patent No.: US 12,212,337 B2
(45) Date of Patent: Jan. 28, 2025

(54) ECC OPTIMIZATION

(71) Applicants: XILINX, INC., San Jose, CA (US);
Advanced Micro Devices, Inc., Santa Clara, CA (US)

(72) Inventors: Kumar Rahul, Hyderabad (IN); John J. Wuu, Fort Collins, CO (US); Santosh Yachareni, Hyderabad (IN)

(73) Assignees: XILINX, INC., San Jose, CA (US); Advanced Micro Devices, Inc., Santa Clara, CA (US)

( * ) Notice: Subject to any disclaimer, the term of this patent is extended or adjusted under 35 U.S.C. 154(b) by 22 days.

(21) Appl. No.: 18/128,943

(22) Filed: Mar. 30, 2023

(65) Prior Publication Data
US 2024/0333307 A1    Oct. 3, 2024

(51) Int. Cl.
*H03M 13/11* (2006.01)
*H03M 13/00* (2006.01)

(52) U.S. Cl.
CPC ..... *H03M 13/1174* (2013.01); *H03M 13/616* (2013.01)

(58) Field of Classification Search
CPC .......... H03M 13/1174; H03M 13/616
See application file for complete search history.

(56) References Cited

U.S. PATENT DOCUMENTS

| 5,631,915 A | * | 5/1997 | Meaney | G06F 11/1012 714/763 |
| 10,177,794 B1 | * | 1/2019 | Rahul | G06F 11/1012 |
| 2018/0039540 A1 | * | 2/2018 | Lu | G06F 11/1048 |

OTHER PUBLICATIONS

L.-J. Saiz-Adalid, J. Gracia-Morán, D. Gil-Tomás, J. .-C. Baraza-Calvo and P.-J. Gil-Vicente, "Ultrafast Codes for Multiple Adjacent Error Correction and Double Error Detection," in IEEE Access, vol. 7, pp. 151131-151143, 2019, (Year: 2019).*

* cited by examiner

*Primary Examiner* — Cynthia Britt
(74) *Attorney, Agent, or Firm* — Patterson + Sheridan, LLP

(57) ABSTRACT

An integrated circuit (IC) device includes an error correction code (ECC) encoder circuitry configured to receive input data, determine min-terms in a Hamming matrix (H-Matrix) corresponding to the input data, and generate ECC data based on the min-terms and an output codeword based on the ECC data, and an error correction circuitry configured to generate a corrected output codeword based on the output codeword.

22 Claims, 10 Drawing Sheets

| | | | | | | | |
|---|---|---|---|---|---|---|---|
| d0 | d1 | d5 | P5 | d15 | P4 | P3 | |
| d37 | d4 | d8 | d11 | d18 | d21 | d27 | P0 |
| d36 | d3 | d7 | d10 | d17 | d20 | d26 | P1 |
| d40 | d43 | d47 | d14 | d52 | d24 | d30 | d33 |
| d35 | d2 | d6 | d9 | d16 | d19 | d25 | P2 |
| d39 | d42 | d46 | d13 | d51 | d23 | d29 | d32 |
| d38 | d41 | d45 | d12 | d50 | d22 | d28 | d31 |
| | d44 | d48 | d49 | d53 | d54 | d55 | d34 |

Table 310:

| | | | | | | | |
|---|---|---|---|---|---|---|---|
| I0= | d37 | d4 | d8 | d11 | d18 | d21 | |
| I1= | d36 | d3 | d7 | d10 | d17 | d20 | |
| I0I1= | d40 | d43 | d47 | d14 | d52 | d24 | d33 |
| I2= | d35 | d2 | d6 | d9 | d16 | d19 | |
| I0I2= | d39 | d42 | d46 | d13 | d51 | d23 | d32 |
| I1I2= | d38 | d41 | d45 | d12 | d50 | d22 | d31 |
| I0I1I2= | d44 | d48 | d49 | d53 | d54 | d34 | |
| I3= | d55 | d28 | d29 | d25 | d30 | d27 | |
| I4= | d54 | d22 | d23 | d19 | d24 | d21 | |
| I3I5= | d53 | d50 | d51 | d16 | d52 | d18 | d15 |
| I5= | d49 | d12 | d13 | d9 | d14 | d11 | |
| I4I5= | d48 | d45 | d46 | d6 | d47 | d8 | d5 |
| I3I4I5= | d44 | d41 | d42 | d2 | d43 | d4 | d1 |
| I3I4I5= | d38 | d39 | d35 | d40 | d36 | d0 | |

Table 315:

| | | | | | | |
|---|---|---|---|---|---|---|
| ECC0 (S0) | p0 | p0p1 | p0p1 | p0p2 | p0p2 | p0p1p2 |
| ECC1 (S1) | p1 | p0p1 | p0p1 | p1p2 | p1p2 | p0p1p2 |
| ECC2 (S2) | p2 | p0p2 | p0p2 | p1p2 | p1p2 | p0p1p2 |
| ECC3 (S3) | p3 | p3p4 | p3p4 | p3p5 | p3p5 | p3p4p5 |
| ECC4 (S4) | p4 | p3p4 | p3p4 | p4p5 | p4p5 | p3p4p5 |
| ECC5 (S5) | p5 | p3p5 | p3p5 | p4p5 | p4p5 | p3p4p5 |

Table 510:

| | | | | | | | |
|---|---|---|---|---|---|---|---|
| I0= | d37 | ^d4 | ^d8 | ^d11 | ^d18 | ^d21 | ^d27 | |
| I1= | d36 | ^d3 | ^d7 | ^d10 | ^d17 | ^d20 | ^d26 | |
| I0I1= | d40 | ^d43 | ^d47 | ^d14 | ^d52 | ^d24 | ^d30 | ^d33 |
| I2= | d35 | ^d2 | ^d6 | ^d9 | ^d16 | ^d19 | ^d25 | |
| I0I2= | d39 | ^d42 | ^d46 | ^d13 | ^d51 | ^d23 | ^d29 | ^d32 |
| I1I2= | d38 | ^d41 | ^d45 | ^d12 | ^d50 | ^d22 | ^d28 | ^d31 |
| I0I1I2= | d44 | ^d48 | ^d49 | ^d53 | ^d54 | ^d55 | ^d34 | |
| I3= | d55 | ^d28 | ^d29 | ^d25 | ^d30 | ^d26 | ^d27 | |
| I4= | d54 | ^d22 | ^d23 | ^d19 | ^d24 | ^d20 | ^d21 | |
| I3I4= | d53 | ^d50 | ^d51 | ^d16 | ^d52 | ^d17 | ^d18 | ^d15 |
| I5= | d49 | ^d12 | ^d13 | ^d9 | ^d14 | ^d10 | ^d11 | |
| I3I5= | d48 | ^d45 | ^d46 | ^d6 | ^d47 | ^d7 | ^d8 | ^d5 |
| I4I5= | d44 | ^d41 | ^d42 | ^d2 | ^d43 | ^d3 | ^d4 | ^d1 |
| I3I4I5= | d38 | ^d39 | ^d35 | ^d40 | ^d36 | ^d37 | ^d0 | |
| t= | d0 | ^d1 | ^d5 | ^d15 | | | | |

Table 515:

| ECC0 (S0) | p0 | p0p1 | p0p1 | p0p2 | p0p1p2 | | | |
|---|---|---|---|---|---|---|---|---|
| ECC1 (S1) | p1 | p0p1 | p0p2 | p1p2 | p0p1p2 | | | |
| ECC2 (S2) | p2 | p0p2 | p1p2 | p1p2 | p0p1p2 | | | |
| ECC3 (S3) | p3 | p3p4 | p3p4 | p3p5 | p3p4p5 | | | |
| ECC4 (S4) | p4 | p3p4 | p3p5 | p4p5 | p3p4p5 | | | |
| ECC5 (S5) | p5 | p3p5 | p4p5 | p4p5 | p3p4p5 | | | |
| ECC6 (S6) | p0p1p2 | p1p2 | p0p2 | p0p2 | p2 | p0p1 | p0 | t6 |
| | Parity0 | Parity1 | Parity2 | Parity3 | Parity4 | p1 | Parity5 | |

ECC OPTIMIZATION

TECHNICAL FIELD

Examples of the present application relate to optimizing the generation of syndrome bits of Hamming code.

BACKGROUND

Error correction code (ECC) is used for detecting and correcting errors in data transmitted over noisy communication channels. ECC is redundant data included in a data transmission. The redundancy allows for the detection of errors anywhere in the data transmission and allows the data transmission to be corrected without a retransmission.

Hamming codes are a family of ECCs. Hamming codes can detect one and two bit errors and correct one bit errors. On the other hand, other types of ECC can only detect errors without correcting them.

SUMMARY

In one or more examples, an integrated circuit (IC) device includes an error correction code (ECC) encoder circuitry. The ECC encoder circuitry is configured to receive input data, determine min-terms in a Hamming matrix (H-Matrix) corresponding to the input data, generate ECC data based on the min-terms and an output codeword based on the ECC data, and output the ECC data and the output codeword.

In one or more examples, an integrated circuit (IC) device includes an error correction code (ECC) decoder circuitry. The ECC decoder circuitry is configured to receive an output codeword, and generate a syndrome based on the output codeword and min-terms in a Hamming Matrix (H-Matrix), wherein the min-terms are determined corresponding to input data, and the output codeword is generated based on ECC data that is generated based on the min-terms.

In one or more examples, a method for operating an integrated circuit (IC) device includes receiving, by an error correction code (ECC) encoder circuitry, input data, determining, by the ECC encoder circuitry, min-terms in a Hamming matrix (H-Matrix) corresponding to the input data, generating, by the ECC encoder circuitry, ECC data based on the min-terms; and generating, by the ECC encoder circuitry, an output codeword based on the ECC data.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 3A-3C illustrate process steps for breaking down a Hamming Matrix (H-matrix) into min terms and using the min-terms to determine ECC data bits and syndrome bits using single error correction (SEC) Hamming code.

FIG. 4 illustrates an example H-Matrix according to one or more examples.

FIGS. 5A-5C illustrate process steps for breaking down an H-matrix into min-terms and using the min-terms to determine ECC data bits and syndrome bits using double error detection (SEC-DED) Hamming code according to one or more examples.

DETAILED DESCRIPTION

Figure 1:
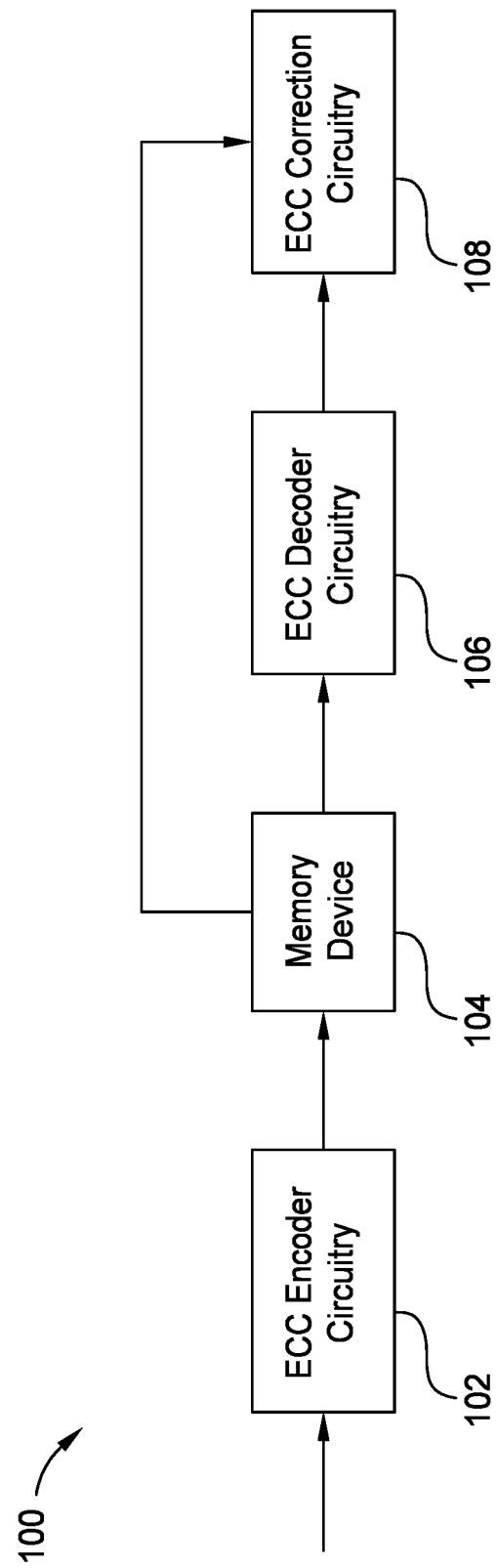
FIG. 1 illustrates an integrated circuit (IC) device, according to one or more examples.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the features or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Conventionally when calculating a Hamming code syndrome, a Hamming Matrix (H-Matrix) is multiplied with a codeword. Hardware, such as an encoder and/or a decoder used to calculate the Hamming code syndrome, are realized by at least a plurality of exclusive OR (XOR) logic gates. Each binary "1" present in the H-Matrix requires an additional XOR logic gate in the corresponding hardware. However, during the multiplication, the same terms may be multiplied numerous times. Embodiments herein relate to breaking down an H-Matrix into min-terms so that multiplications are not repeated. This reduces the number of XOR gates required in hardware, saving chip space, increases the speed of determining a syndrome (i.e., requires less calculations), and reduces power consumption.

FIG. 1 illustrates an integrated circuit (IC) device 100, according to one or more examples. The IC device 100 includes ECC encoder circuitry 102, memory device 104, ECC decoder circuitry 106, and error correction circuitry 108.

The ECC encoder circuitry 102 receives input data. The input data is N bits in length. The value of N may be equal to any suitable length of a data transmission, such as 32-bits or 64-bits. In one example, the input data is represented as an input vector of length N.

The ECC encoder circuitry 102 receives the input data and performs an encoding operation on the input vector. In one example, the encoding operation includes generating ECC data, and generating an output codeword by encoding the input vector with the ECC data. The output codeword comprises the input data with the additional ECC data. The ECC data is used to check the input data for errors. In one example, the ECC encoder circuitry 102 is realized using a plurality of exclusive OR (XOR) logic gates.

In one example, the ECC encoder circuitry 102 generates ECC data that is r bits in length. In one example the ECC data is parity bits used for Hamming code. The value of r depends on the value of N and the type of Hamming code being used. If single error correction (SEC) Hamming code is being used, r is determined using $2^r \geq N+r+1$. For example, if N is equal to 4, r would have to equal at least 3. Hamming code is described in terms of (N+r, N). For example, the previously described example is known as (7,4) Hamming code. If double error detection (SEC-DED) Hamming code is being used r is determined using $2^r+1 \geq N+r+1$. Stated differently, SEC-DED Hamming code requires one extra ECC data bit. For example if N equals 7, r is equal to 4.

In one example, the ECC encoder circuitry 102 generates the ECC data using the Hamming Matrix (H-Matrix). The H-Matrix is pre-determined and is based on the value of N and r. The dimensions of the H-Matrix are r by N+r. For example if N is equal to 7, and SEC Hamming code is being used (i.e., r equals 3) the H-Matrix is 3 by 7. In another example if N is equal 7, and SEC-DED Hamming code is being used (r equals 4), the H-Matrix is 4 by 7. The difference between the H-Matrices for SEC and SEC-DED Hamming code when N is equal to 7 is that the additional row in the H-Matrix used in SEC-DED Hamming code includes all binary "1." The H-Matrix will be described in more detail below.

As described above, in one example, the ECC encoder circuitry 102, generates the ECC data, and encodes the input data with the ECC data, forming an output codeword. In one example, the length of the output codeword is equal to N+r. The output codeword may be realized as an output vector and includes the ECC data interleaved with the input data. For example, if N is equal to 4, the codeword length is 7.

In one example, the ECC encoder circuitry 102 generates the ECC data by performing matrix multiplication between the input vector and the H-Matrix. However, because the ECC data is not generated yet, the ECC encoder circuitry 102 generates a temporary codeword to make the dimensions match. The ECC encoder circuitry 102 generates a temporary codeword that includes placeholders for the to-be-determined ECC data (i.e., parity bits). Because the value of the ECC data bits are unknown, the ECC encoder circuitry 102 generates the temporary codeword by encoding the input vector with binary "0" in the place of each ECC data bit. The temporary codeword is represented as a temporary vector having a length of N+r. For example, if N equals 4, the ECC encoder circuitry 102 will add 3 binary "0" to the input vector, forming a temporary codeword (vector).

In one example, the ECC data is determined by multiplying the H-Matrix with the transpose of the temporary codeword (i.e. the temporary codeword represented as a column vector). This results in an ECC data vector representing the ECC data. For example multiplying a 3 by 7 H-Matrix with a 7 by 1 temporary codeword results in 3 ECC data bits.

However, each binary "1" included in the H-Matrix requires an XOR gate. This results in a significant quantity of XOR gates. In one example, the ECC encoder circuitry 102 can reduce the number of calculations required to determine the ECC data based on min-terms in the H-Matrix. Stated differently, the ECC encoder circuitry 102 determines min-terms that are calculated multiple times when performing the matrix multiplication. Therefore, the ECC encoder circuitry 102 does not perform the same calculation multiple times, and thus, optimizes (reduces) the quantity of XOR gates required. This will be described in more detail below.

After determining the ECC data, the ECC encoder circuitry 102 replaces the placeholder binary "0" in the temporary codeword with the corresponding generated ECC data bits (if necessary) forming an the output codeword.

A memory device 104, such as a static random access memory (SRAM), receives the input data along with the ECC data and the output codeword from the ECC encoder circuitry 102 and stores them. The memory device 104 may then provide the output codeword to both the ECC decoder circuitry 106 and error correction circuitry 108. The ECC decoder circuitry 106 generates syndrome bits (which can be represented as a syndrome vector) in the same manner that ECC data bits were generated, thus, optimizing the quantity of XOR gates required to realize the ECC decoder circuitry 106.

The ECC decoder circuitry 106 provides the syndrome vector to the error correction circuitry 108. The error correction circuitry 108 determines whether there is an error in the output codeword based on the syndrome. Stated differently, the syndrome is used to determine whether the codeword was transmitted on a noisy channel to and from the memory device 104. The error correction circuitry 108 determines whether an error is present in the output codeword and corrects the error based on the type of error and type of correction code being used. If single error correction (SEC) Hamming code is being used, the error correction circuitry 108 can detect a single bit that is in error, correct the error, and output a corrected codeword. On the other hand, if the error correction circuitry 108 does not detect an error it outputs the output codeword.

If double error detection (SEC-DED) Hamming code is being used, the error correction circuitry 108 can detect both single and double bit errors, and correct single bit errors. If all the bits in the syndrome vector are binary "0," there is no error and the error correction circuitry 108 simply outputs the output codeword. On the other hand, if there are an even number of binary errors in the output codeword, then the binary value of an additional ECC data bit is SEC-DED Hamming code as compared to SEC Hamming code will be "0," and the error correction circuitry 108 determines the output codeword includes an uncorrectable multi-bit error (e.g., at least two bits) and outputs an error signal. If the error correction circuitry 108 determines the additional ECC data bit in SEC-DED Hamming code, as compared to SEC Hamming code, as binary "1," an odd number of bits are in error are in error or a single bit error is present on the output codeword, and the error correction circuitry 108 corrects the error and outputs a corrected output codeword. In one example, the output codeword or the corrected output codeword is transmitted by the error correction circuitry 108 from the IC 100 to another device. While FIG. 1 illustrates a single IC device 100, the components described above may be implemented across different devices. In one example, the output of the ECC encoder circuitry is transmitted from a first IC device to a second IC device, and the second IC device includes one or more of the memory device 104, the ECC decoder circuitry 106, and the error correction circuitry 108.

Figure 2:
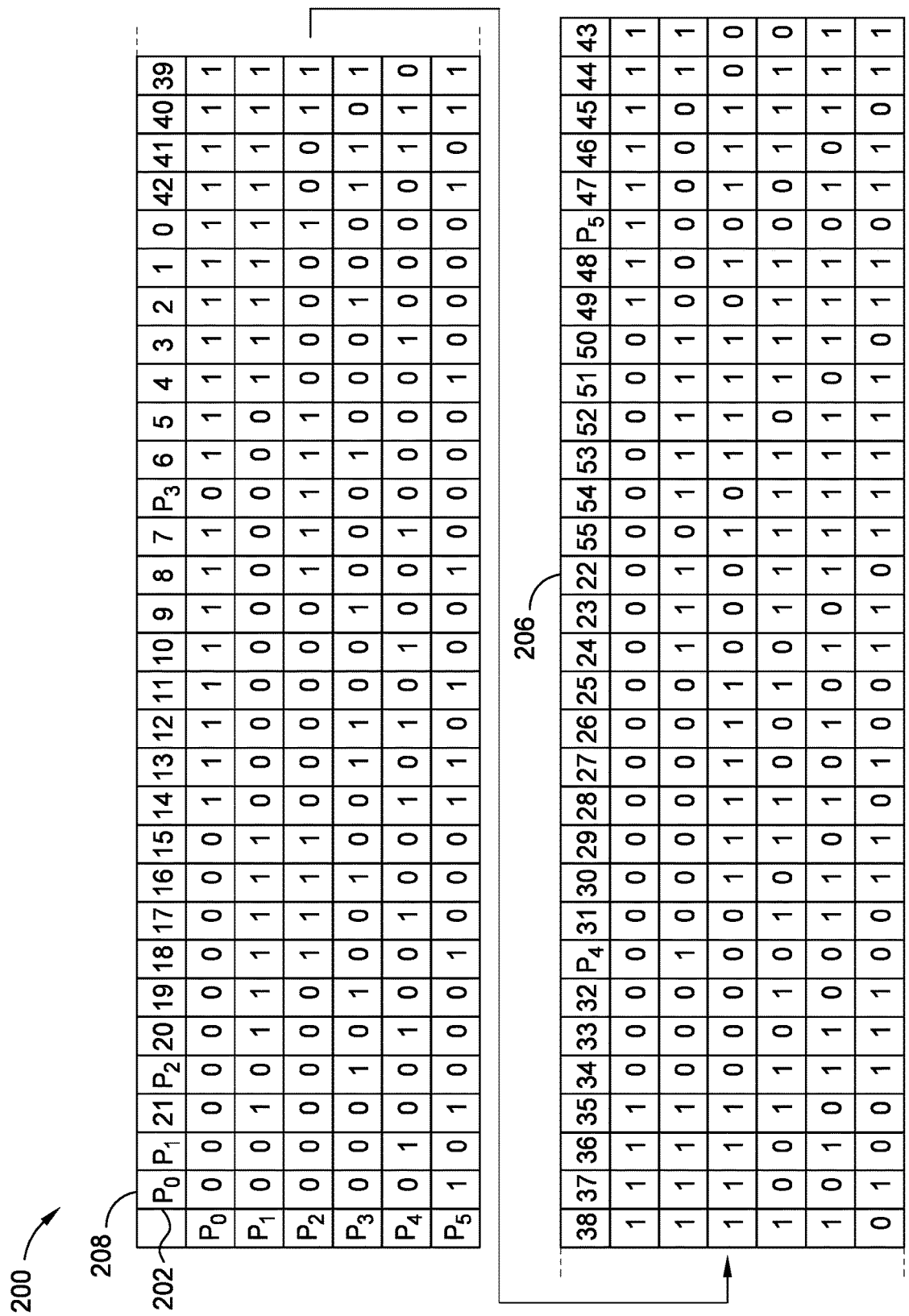
FIG. 2 illustrates an example H-Matrix according to one or more examples.

FIG. 2 illustrates an example H-Matrix 200 according to one or more examples.

FIG. 2 represents an H-Matrix 200 for (63,57) SEC Hamming code. As described above the H-Matrix 200 is previously known. Each of the rows of the H-Matrix 200 correspond to a bit of the ECC data (i.e., parity bits $P_0$-$P_5$). Each of the columns of the H-Matrix 200, if converted from binary to decimal, represents a distinct decimal value. Each distinct decimal value represents a signature of an ECC data bit or an input data bit.

The weight of a row or column of the H-Matrix is equal to the number of binary "1" in said row/column. Each of the columns that represent a signature of an ECC data bit have a weight of one. Stated differently each column that represents an ECC data bit has exactly one binary "1". For example the columns (labeled $P_0$-$P_5$) that represent the ECC data bits include binary "000001" (signature equal to decimal "1"), 000010 (signature equal to decimal "2"), 000100

(signature equal to decimal "4"), and so on. The remaining columns represent the input data bits.

Row 202 indicates which signature belongs to each data bit. The values in row 202 indicate which input data bit or ECC data bit is represented by the signature. The data bits are labeled from 0-57 with zero corresponding to the signature of the least significant bit (LSB) of the input data. As described above the ECC data bits are labeled as $P_0$-$P_5$ with $P_0$ corresponding to the first parity bit and $P_5$ corresponding to the sixth parity bit. For example, column 206 represents the signature in the $23^{rd}$ bit of the input data. As another example, column 208 represents the signature of the first ECC data bit ($P_0$). The order of terms in the H-Matrix 200 does not matter so long as the columns in the H-Matrix 200 are in the same order as the bits in the temporary (and output) codeword.

As described above, H-Matrix 200 may be broken down into separate min-terms used to reduce the number of XOR gates required in the ECC encoder circuitry 102 for generating the ECC data bits, and in the ECC decoder circuitry 106 for calculating a syndrome.

Figure 3B:
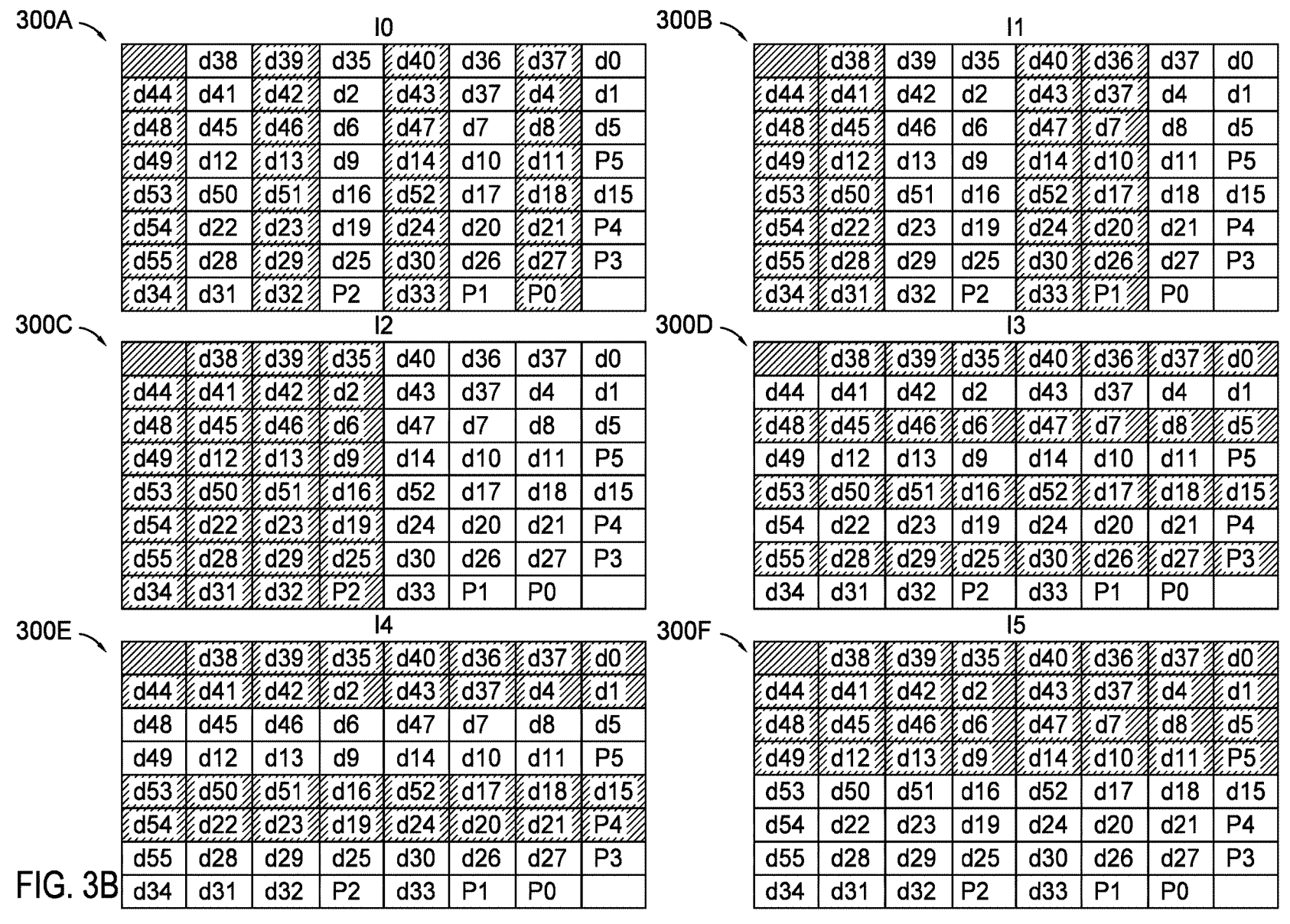

FIGS. 3A-3C illustrate process steps for breaking down the H-Matrix 200 into min-terms and using the min-terms to determine ECC data bits and syndrome bits using single error correction (SEC) Hamming code.

FIG. 3A illustrates an example table 300 used to represent the signatures of H-Matrix 200.

The ECC encoder circuitry 102 and ECC decoder circuitry 106 both organize the H-Matrix into table 300 based on the signatures of the input data bits and ECC data bits. In one example, the input data bits and the ECC data bits are ordered from lowest signature value to highest signature value (in decimal). Each of the input data bits are represented by $d_x$, where x represents location of the input data bit within the input vector from the least significant bit (LSB) to the most significant bit (MSB). For example do represents the first data bit and das represents the $24^{th}$ data bit. Each of the ECC data bits are represented as $P_y$, where y is a value that ranges from 0 to r−1. For example for (63,57) code y ranges from 0 to 5.

The dimensions of table 300 are determined based on the number of columns in H-Matrix 200. Stated differently, the size of table 300 must be greater than or equal to N+r. For example, because N+r equals 63, table 300 is an 8 by 8 table allowing for 64 entries.

As described above, each of the signatures in the H-Matrix 200 range from 1 to 63 and are organized into table 300 from least to greatest. Table 300 is populated from right-to-left and bottom-to-top from least signature to greatest signature starting from 0 in the bottom right corner. Stated differently, the entries of table 300 represent potential signatures in decimal from 0 to 64. If a signature does not exist in the H-Matrix 200, the corresponding entry is left blank. For example, the bottom row will be populated with representations of the input data bits and/or ECC data bits having signatures that range from 0-7 from right to-left. For example, using H-Matrix 200, the entries from right-to-left of the bottom row of table 300 are: blank, $P_0$, $P_1$, $d_{33}$, $P_2$, $d_{32}$, $d_{31}$, $d_{34}$. This is then repeated for each of the rows. For example, the second row from the bottom from right-to-left will include representations of the input data bits and/or ECC data bits having signatures from 8-15, and so on.

FIG. 3B illustrates tables 300A-300F used to determine min-terms used in the calculation of ECC data bit or syndrome bits.

As illustrated in FIG. 3B, the ECC encoder circuitry 102 and ECC decoder circuitry 106 replicate table 300 based on the quantity of ECC data bits. The quantity of tables is equal to the quantity of ECC data bits in the H-Matrix 200. For example, (63, 57) code requires 6 tables.

Using tables 300A-300F, the ECC encoder circuitry 102 and ECC decoder circuitry 106 can determine min-terms used when performing matrix multiplication between a codeword and H-Matrix 200. Stated differently, tables 300A-300F are used to determine terms that are used multiple times when generating ECC data or a syndrome. The ECC encoder circuitry 102 and ECC decoder circuitry 106 will then re-use already determined min-terms, reducing the number of operations performed, and thus, optimize the quantity of XOR gates.

Each table 300A-300F is labeled as $i_y$. For example table 300A is $i_0$, table 300B is $i_1$, and so on. Different terms (entries) are selected from each table 300A-300F are based on the value of y and are used to determine the min-terms. In one example, the highlighted entries in each of the tables represent table entries that are selected.

In one example, $2^y$ entries are selected and then $2^y$ entries are skipped across each of the rows. The entries are selected/skipped from left-to-right and top-to-bottom of each table 300A-300F starting from the top-right entry of each table 300A-300F until the bottom-left entry is reached. For example, in table 300A, y is equal to 0. Therefore, starting from the top-right corner of table 300A every other entry (moving row-wise) is selected (highlighted). Stated differently, the blank top-right entry is selected (highlighted), $d_{38}$ is skipped, $d_{39}$ is selected, and so on until the blank bottom-left entry is reached. As another example in table 300B y is equal to 1. Therefore, every two entries are selected and then skipped. The blank top-right entry and $d_{38}$ are selected, $d_{39}$ and $d_{35}$ are skipped, $d_{40}$ and $d_{36}$ are selected, and so on. This is repeated for the remaining tables. Then the min-terms are determined based on the selected terms in each table 300A-300F.

Referring to FIG. 3C, as illustrated in table 310, the min-terms are calculated based on the selection of rows and columns in tables 300A-300F. Each of the rows and columns of each table 300A-300F are each associated to one mid-term. Each min-term is represented by which table(s) 300A-300F said row or column is selected in. Each column and row is labeled with the label from each table 300A-300F that said row or column are selected from. For now, ECC data bits in each row and column are ignored. For example the first column from the right that includes $d_{44}$-$d_{34}$ is selected in tables 300A-300C. There the column that includes $d_{44}$-$d_{34}$ is represents as min-term $i_0 i_1 i_2$. This is repeated for each of the rows and columns. Each of the min-terms are calculated by inputting each included input data bit into 2-input XOR gates (as denoted by the "^" sign in table 310). Stated differently, each min-term is calculated by inputting the data bits that make up each min-term into 2-input XOR gates.

Next, the ECC data bits may be determined by the ECC encoder circuitry 102, by multiplying the H-Matrix 200 with the temporary codeword. Each of the ECC data bits are represented as $ECC_z$. Based on linear algebra rules, and as illustrated in table 315, each min-term that has a subscript (y) that is equal to z is used to calculate a corresponding ECC data bit. Each ECC data bit is calculating each min-term in which a subscript y is equal to z (as denoted by the "^" symbol in table 315). For example, $ECC_0$ is determined using each min-term that includes $i_0$. Therefore, $ECC_0$ is determined using $i_0$, $i_0 i_1$, $i_0 i_2$, and $i_0 i_1 i_2$. Stated differently, $ECC_0$ is determined by inputting $i_0$, $i_0 i_1$, $i_0 i_2$, and $i_0 i_1 i_2$ into 2-input XOR gates. This can be repeated for each ECC data bit.

Advantageously, when the ECC encoder circuitry 102 multiplies the H-Matrix 200 with a temporary codeword to determine the ECC data bits, the ECC encoder circuitry 102 will not re-calculate previously calculated terms. For example, when calculating $ECC_0$-$ECC_3$ $i_0i_1$, $i_0i_2$, and $i_0i_1i_2$ will only be calculated once and will be reused in each calculation.

As described above, the ECC encoder circuitry 102 generates an output codeword from the temporary codeword and the ECC data, and provides the calculated ECC data bits and the output codeword to the memory device 104. The memory device 104 receives the input data and the output codeword and stores them into memory device 104.

The memory device 104 may then provide the output codeword to both the ECC decoder circuitry 106 and error correction circuitry 108. The ECC decoder circuitry 106 generates a syndrome vector in the same manner that ECC data bit vector was generated, thus optimizing the XOR gates required to realize the ECC decoder circuitry 106.

The ECC decoder circuitry 106 provides the syndrome vector to the error correction circuitry 108. The syndrome vector includes syndrome bits $S_0$-$S_5$ which are calculated as shown in table 315. The syndrome and the ECC data are calculated the same way using the same min-terms. The error correction circuitry 108 determines whether there is an error in the output codeword based on the syndrome. Stated differently, the syndrome vector is used to determine whether the codeword was transmitted on a noisy channel to and from the memory device 104 which cause an error. Because this is (SEC) Hamming code, if all the bits in the syndrome vector are binary "0," there is no error and the error correction circuitry 108 simply outputs the output codeword. If any of the bits are binary "1," the syndrome vector is equal to the signature of the input bit that is in error. For example, if the syndrome vector is 010001, input data bit da is in error. The error correction circuitry 108 corrects input data bit $d_{21}$, generating a corrected output codeword. The error correction circuitry 108 then outputs the corrected codeword.

Figure 4:
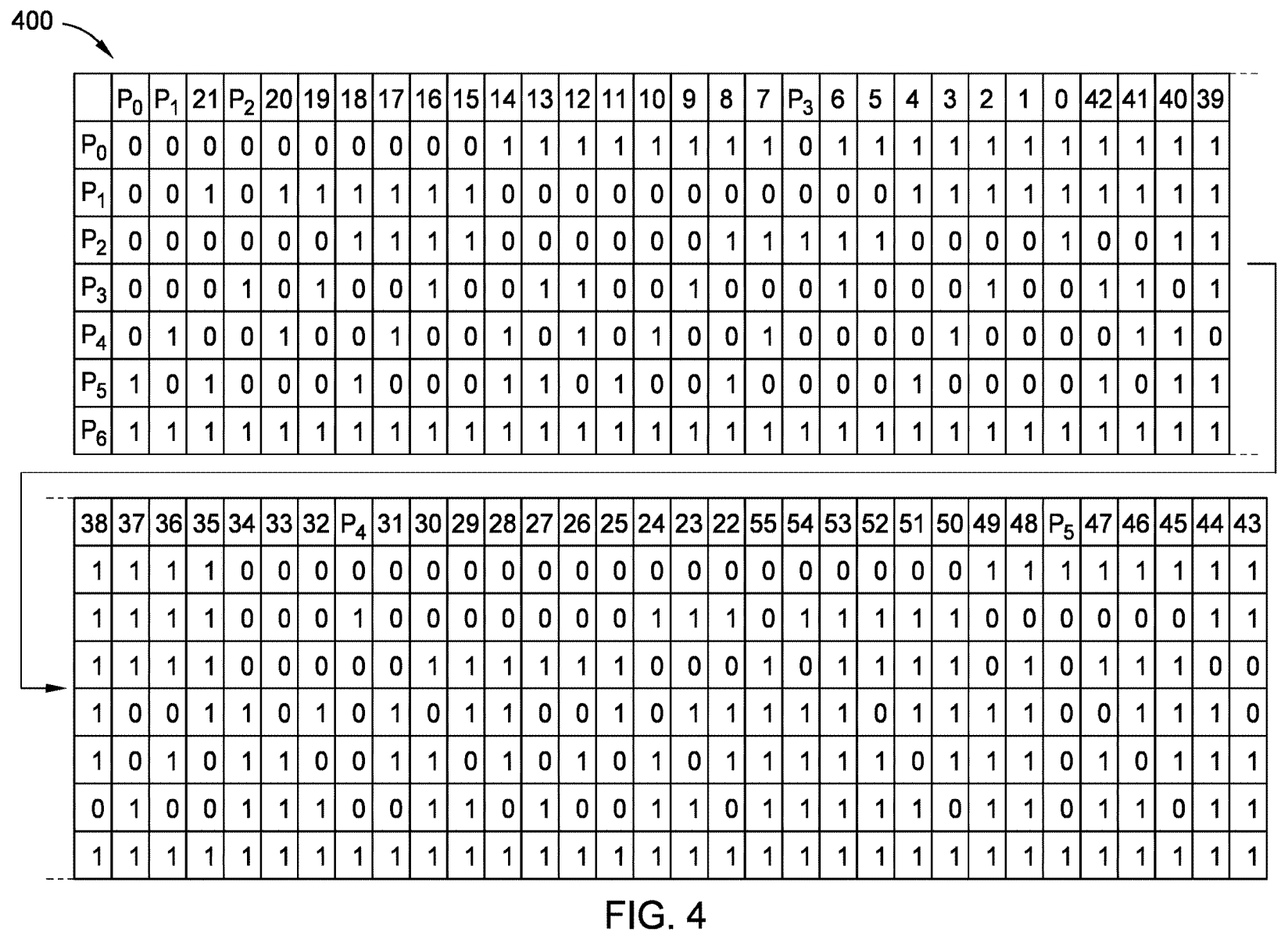

FIG. 4 illustrates an example H-Matrix 400 according to one or more examples. The H-Matrix 400 for (64,57) SEC-DED Hamming code. H-Matrix 400 represents the same input data as H-Matrix 200 except that it includes an extra ECC data bit for SEC-DED Hamming code. The extra ECC data bit is represent by a row of all binary "1." When determining the signatures represented by H-Matrix 400 the row corresponding to the extra ECC data bit may be ignored.

Figure 5A:
Figure 5B:
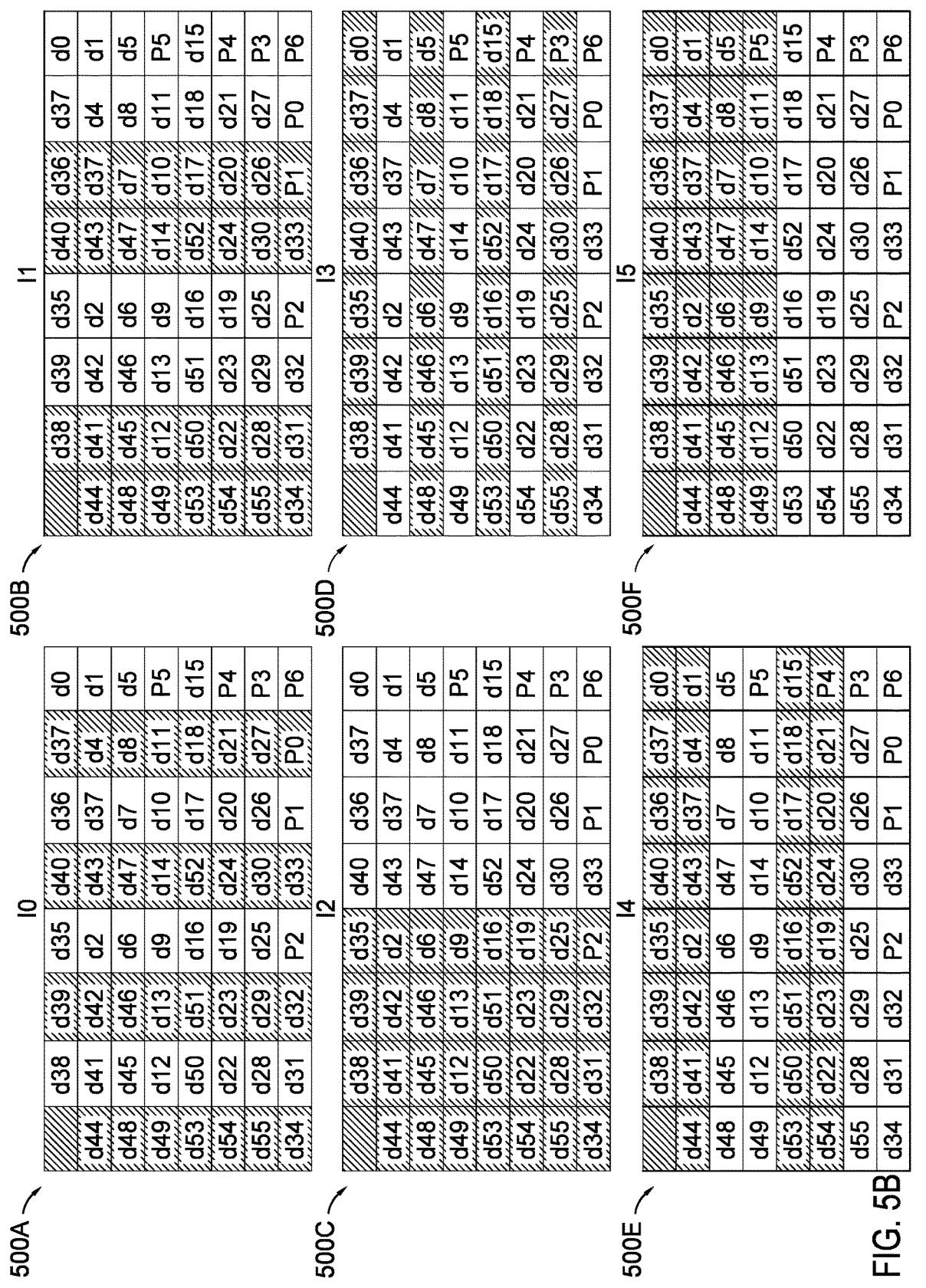

FIGS. 5A-5C illustrate process steps for breaking down an H-Matrix 400 into min-terms and using the min-terms to determine ECC data bits and syndrome bits using double error detection (SEC-DED) Hamming code.

FIG. 5A illustrates an example table 500 used to represent the signatures of the H-Matrix 400. As described above, the additional row in H-Matrix 400 may be ignored when determining the signatures. Therefore, the table 500 is similar to table 300 except that the additional ECC data bit $P_6$ has a signature of decimal "0" as it is not represented in a column of the H-Matrix 400.

FIG. 5B illustrates tables 500A-500F used to determine min-terms used in the calculation of ECC data bit or syndrome bits. As illustrated in FIG. 5B, the min-terms are represented in a similar manner as those in tables 300A-300F.

Referring to FIG. 5C, as illustrated in table 510 the min-terms are determined in similar to those determined using SEC Hamming code. The only difference is that an additional mid-term the is determined which represents the column in each of the tables 500A-500F that was not selected. Furthermore, as illustrated in table 515 the ECC data bits and the syndrome are calculated in substantially the same manner except an additional ECC data bit $ECC_6$ and additional syndrome bit $S_6$ is calculated.

As described above, the ECC encoder circuitry 102 may then provide the calculated ECC data bits to the memory device 104. The memory device 104 receives and stores the input data and the output codeword.

The memory device 104 may then provide the output codeword to both the ECC decoder circuitry 106 and error correction circuitry 108. The ECC decoder circuitry 106 generates a syndrome vector in the same manner that ECC data bit vector was generated, thus optimizing the XOR gates required to realize the ECC decoder circuitry 106.

The ECC decoder circuitry 106 provides the syndrome vector to the error correction circuitry 108. The error correction circuitry 108 determines whether there is an error in the output codeword based on the syndrome. Stated differently, the syndrome vector is used to determine whether the codeword was transmitted on a noisy channel to and from the memory device 104. If all the bits in the syndrome vector are binary "0," there is no error and the error correction circuitry 108 simply outputs the output codeword.

In one example, the syndrome bit $S_6$ is used to determine whether there is a single bit error or a double bit error. If syndrome bit $S_6$ is equal to binary "1," syndrome bit $S_6$ indicates a single bit error in the output codeword and the error correction circuitry 108 corrects the error. On the other hand if syndrome bit $S_6$ is binary "0," and any one of the syndrome bits $S_0$-$S_5$ are non-zero, there is an uncorrectable double bit error in the output codeword.

Figure 6:
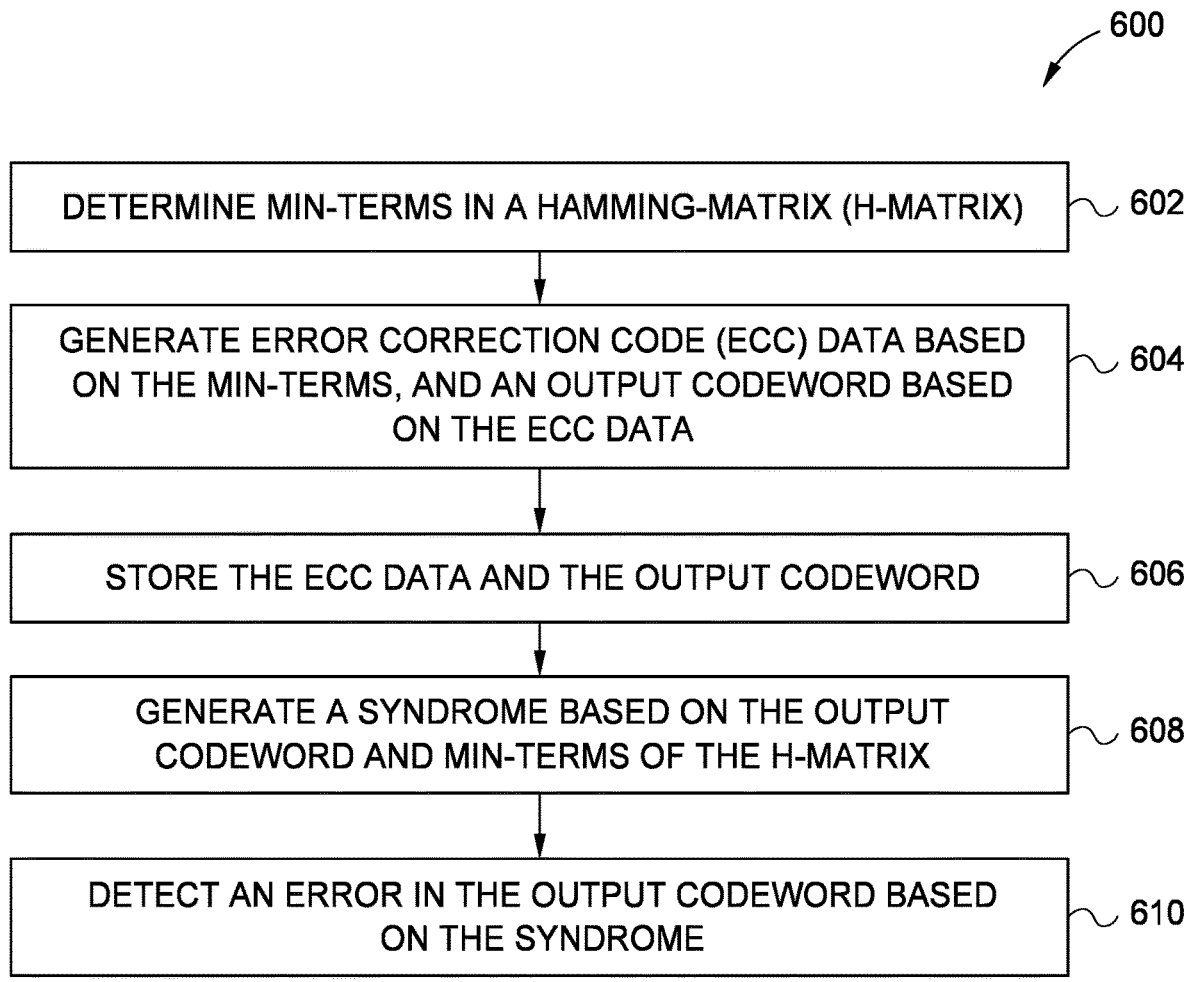
FIG. 6 is flow chart of a method for operating an IC device according to one or more examples.

FIG. 6 is a flow chart of a method 600 for operating an IC device 100 according to one or more examples. FIG. 6 is described with reference to FIG. 1, FIG. 2, FIGS. 3A-3C, FIG. 4, and FIGS. 5A-5C.

At step 602, the ECC encoder circuitry 102 determines min-terms in an H-Matrix (e.g., H-Matrix 200 or 400) in the manner described in FIGS. 3A-3C for SEC Hamming code and in the same manner described in FIGS. 5A-5C for SEC-DED Hamming code.

At step 604, and as described in FIGS. 3A-3C for SEC Hamming code and in FIGS. 5A-5C for SEC-DED Hamming code, the ECC encoder circuitry 102 generates ECC data and an output codeword by multiplying an H-Matrix (e.g., H-Matrix 200 or 400) with a temporary codeword. The ECC encoder circuitry 102 generates the temporary code word by adding binary "0" to an input data vector. The ECC encoder circuitry 102, using the min-terms, multiplies an H-Matrix with the temporary codeword to determine the ECC data, and replaces the binary "0" (if necessary) with the ECC data, forming the output codeword. Advantageously, as described above, the ECC encoder circuitry 102 re-uses the determined min-terms, which optimizes the quantity of XOR gates required to realize the ECC encoder circuitry 102

At step 606, the memory device 104 receives and stores the output codeword and the ECC data.

At step 608, the ECC decoder circuitry 106 determines min-terms in an H-Matrix (e.g., H-Matrix 200 or 400) and generates a syndrome. The ECC decoder circuitry 106 uses the same H-Matrix as the ECC encoder circuitry 102. The ECC decoder circuitry 106 circuitry generates the syndrome by multiplying an H-Matrix with the output codeword. The ECC decoder circuitry 106 determines the min-terms and calculates the syndrome in the same manner the ECC encoder circuitry 102 determines the ECC data, except that the ECC decoder circuitry 106 uses the output codeword instead of the temporary codeword.

At step 610, the error correction circuitry 108 receives the syndrome from the ECC decoder circuitry 106 and the output code word from the memory device 104 and detects an error in the output codeword. In one example, the error correction circuitry 108 detects and corrects single bit errors if SEC Hamming code is used. If the error correction circuitry 108 detects an error it generates and outputs a corrected output codeword. On the other hand, if an error is not detected, the error correction circuitry 108 outputs the output codeword. In another example, if SEC-DED Hamming code is being used, the error correction circuitry 108 detects single and double bit errors. If the error correction circuitry 108 detects a single bit error it generates and outputs a corrected output codeword. However, if the error correction circuitry 108 detects a double bit error it is not correctable and the error correction circuitry 108 outputs an error signal.

In the following an IC device 100 is able to breakdown an H-Matrix into min-terms. This reduces the number of calculations required to generate ECC data and a syndrome. This reduces the hardware required to implement an ECC encoder circuitry 102 and an ECC decoder circuitry 106 saving chip size, improves the speed and efficiency of the IC device 100, and reduces power consumption.

While the foregoing is directed to specific examples, other and further examples may be devised without departing from the basic scope thereof, and the scope thereof is determined by the claims that follow.

What is claimed is:

1. An integrated circuit (IC) device comprising:
an error correction code (ECC) encoder circuitry configured to:
generate ECC data based on the min-terms in a Hamming matrix (H-Matrix) corresponding to input data;
generate an output codeword based on the ECC data; and
output the ECC data and the output codeword; and
a memory device configured to receive the ECC data and the output codeword from the ECC encoder circuitry, wherein the ECC data and the output codeword are used to detect an error within the input data stored within the memory device.

2. The IC device of claim 1, further comprising
an ECC decoder circuitry; and
an error correction circuitry.

3. The IC device of claim 2, wherein:
the ECC decoder circuitry generates a syndrome based on the output codeword and the min-terms of the H-Matrix; and
the error correction circuitry generates a corrected output codeword based on the output codeword and the syndrome.

4. The IC device of claim 3, wherein the ECC decoder circuitry generates the syndrome by multiplying the H-Matrix with the output codeword.

5. The IC device of claim 3, wherein the error correction circuitry is configured to determine a single bit error based on the syndrome, and generate the corrected output codeword based on the single bit error.

6. The IC device of claim 3, wherein the error correction circuitry is configured to generate the corrected output codeword based on determining a single bit error and detect a double bit error.

7. The IC device of claim 3, wherein the ECC encoder circuitry and ECC decoder circuitry are configured to organize the H-Matrix into a plurality of tables based on decimal values across columns of the H-Matrix.

8. The IC device of claim 7, wherein the ECC encoder circuitry and the ECC decoder circuitry are configured to determine the min-terms of the H-Matrix based on columns and rows that are selected in each of the tables.

9. The IC device of claim 1, wherein the ECC encoder circuitry generates the ECC data by multiplying the H-Matrix with a temporary codeword.

10. The IC device of claim 9, wherein the temporary codeword comprises the input data and binary "0"s that represent the ECC data.

11. An integrated circuit (IC) device comprising:
an error correction code (ECC) decoder circuitry configured to:
receive an output codeword from a memory device; and
generate a syndrome based on the output codeword and min-terms in a Hamming Matrix (H-Matrix), wherein the min-terms are determined based on input data, and the output codeword is generated based on ECC data that is generated based on the min-terms, and the syndrome is used to detect errors within the input data stored in the memory device.

12. The IC device of claim 11, wherein the ECC decoder circuitry generates the syndrome by multiplying the H-Matrix with the output codeword.

13. The IC device of claim 11, further comprising an ECC encoder circuitry.

14. The IC device of claim 13, wherein the ECC encoder circuitry determines the min-terms in the H-Matrix, generates the ECC data based on the min-terms, and generates the output codeword based on the ECC data.

15. The IC device of claim 13, wherein the ECC encoder circuitry generates the ECC data by multiplying the H-Matrix with a temporary codeword, and wherein the temporary codeword comprises the input data and binary "0"s that represent the ECC data.

16. The IC device of claim 13, wherein the ECC encoder circuitry and the ECC decoder circuitry are configured to organize the H-Matrix into a plurality of tables based on decimal values across columns of the H-Matrix.

17. The IC device of claim 16, wherein the ECC encoder circuitry and the ECC decoder circuitry are configured to determine the min-terms of the H-Matrix based on columns and rows that are selected in each of the tables.

18. A method for operating an integrated circuit (IC) device comprising:
generating, by the an (ECC) encoder circuitry, ECC data based on min-terms in a Hamming matrix (H-Matrix) corresponding to input data;
generating, by the ECC encoder circuitry, an output codeword based on the ECC data; and
providing, by the ECC encoder circuitry, the ECC data and the output codeword to a memory device, wherein the ECC data and the output codeword are used to detect an error within the input data stored within the memory device.

19. The method of claim 18, wherein generating the ECC data comprises multiplying, by the ECC encoder circuitry, the H-Matrix with a temporary codeword.

20. The method of claim 18, wherein a syndrome is generated by an ECC decoder circuitry based on the output codeword and the min-terms in the H-Matrix, and wherein generating the syndrome comprises multiplying, by the ECC decoder circuitry, the H-Matrix with the output codeword.

21. The method of claim 20, wherein the ECC encoder circuitry and the ECC decoder circuitry organize the H-Matrix into a plurality of tables based on decimal values across columns of the H-Matrix, and determine the min-terms of the H-Matrix based on columns and rows that are selected in each of the tables.

22. The method of claim 20, wherein an error correction circuitry detects single bit errors and double bit errors and generates a corrected output codeword for a single bit error based on the output codeword and the syndrome.

\* \* \* \* \*